(12) United States Patent
Schultz et al.

(10) Patent No.: US 7,154,734 B2
(45) Date of Patent: Dec. 26, 2006

(54) FULLY SHIELDED CAPACITOR CELL STRUCTURE

(75) Inventors: Richard Schultz, Fort Collins, CO (US); Jeffrey Burleson, Fort Collins, CO (US); Steven Howard, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/945,177

(22) Filed: Sep. 20, 2004

(65) Prior Publication Data

US 2006/0061935 A1    Mar. 23, 2006

(51) Int. Cl.
    *H01G 4/228*    (2006.01)
(52) U.S. Cl. .................. 361/306.1; 361/302; 361/303; 361/305; 361/306.2; 361/321.2; 257/306; 257/307
(58) Field of Classification Search ........ 361/302–305, 361/306.2, 311–313, 306.1, 306.3, 328–330; 257/306–307
    See application file for complete search history.

(56) References Cited

U.S. PATENT DOCUMENTS

| | | | |
|---|---|---|---|
| 5,208,725 A | 5/1993 | Akcasu | |
| 5,583,359 A | 12/1996 | Ng et al. | |
| 5,978,206 A | 11/1999 | Nishimura et al. | |
| 6,178,083 B1* | 1/2001 | Appeltans et al. | 361/306.1 |
| 6,266,226 B1* | 7/2001 | Hayashi | 361/303 |
| 6,312,984 B1 | 11/2001 | Dennison | |
| 6,383,858 B1* | 5/2002 | Gupta et al. | 438/238 |
| 6,385,033 B1* | 5/2002 | Javanifard et al. | 361/306.2 |
| 6,410,954 B1* | 6/2002 | Sowlati et al. | 257/306 |
| 6,452,250 B1* | 9/2002 | Buynoski | 257/532 |
| 6,737,698 B1* | 5/2004 | Paul et al. | 257/306 |
| 6,900,497 B1* | 5/2005 | Agarwal et al. | 257/306 |

\* cited by examiner

*Primary Examiner*—Nguyen T. Ha
(74) *Attorney, Agent, or Firm*—Duft, Bornsen and Fishman (57) ABSTRACT

A linear capacitor design providing shielding on all sides of the linear capacitor. In one aspect the capacitor provides a signal side metal layer substantially enclosed by a dielectric material which is, in turn, substantially enclosed by an upper and lower metal shield layer. in another aspect, the upper and lower shield metal layers may be coupled by a plurality of vias. In another aspect, a plurality of alternating intermediate layers provide signal side metal and shield metal separated by dielectric material such that each signal side layer is substantially enclosed by one or more shield metal layers. In another aspect, multiple intermediate signal side metal layers are conductively coupled to one another by a plurality of vias and multiple shield metal layers are conductively coupled to one another by a plurality of vias.

15 Claims, 14 Drawing Sheets

FULLY SHIELDED CAPACITOR CELL STRUCTURE

BACKGROUND OF THE INVENTION

1. Field of the Invention

The invention generally relates to capacitor designs and in particular relates to a capacitor cell structure that provides complete shielding from adjacent cells on all sides of the structure.

2. Discussion of Related Art

Capacitors are electronic circuits that store electrical charge and are generally designed to apply a potential across two electrodes separated by a dielectric layer of material. Capacitors are typically formed in semiconductor integrated circuits by depositing and etching layers of polysilicon and metal conductive terminals (electrodes) and a gate oxide material used as the dielectric layer. A typical capacitor having two such electrodes may be referred to as a 2-sided capacitor. A potential applied between the two electrodes and across the dielectric is substantially retained by the capacitor.

Such semiconductor structures of polysilicon and oxide tend to be highly non-linear in their response to potential differences unless a bias voltage is maintained across the dielectric oxide material. Metal-metal capacitors are formed of two metal conductive surfaces separated by a dielectric material layer. These structures tend to respond in a more linear fashion as compared to semiconductor capacitor structures and hence are often referred to as linear capacitors.

Electronic devices including capacitors are susceptible to "crosstalk" interference from other nearby devices and interconnect signal paths (i.e., conductive signal routes and buses within the same integrated circuit design in close proximity to the capacitor or other circuit). Crosstalk interference is generated by inductance or leakage current flow between a first signal path or circuit and a second signal path or circuit.

In dense integrated circuit designs, it is a particular problem to reduce such crosstalk interference. The dense integration of modern integrated circuit dies places circuits and interconnecting signal paths in very close proximity. To reduce the potential for crosstalk interference in capacitor designs within integrated circuit dies it is common to enforce spacing rules in the circuit die layout to separate a capacitor circuit from surrounding signal paths and circuits. Some prior designs have also provided a shielding layer on top and bottom of the stack of alternating metal or electrode layers. But the shielding layers as presently practiced are not interconnected (i.e., by vias) and do not substantially enclose the signal metal conductive layers (i.e., at the sides of the conductive signal layers). Such designs do not fully shield the metal conductive layers from nearby capacitors and signal paths. Further, the enforced spacing between a capacitor and adjacent signal paths and circuits increase the circuit die size.

It is evident from the above discussion that it remains an ongoing problem to reduce crosstalk interference in integrated circuit capacitor designs.

SUMMARY OF THE INVENTION

The present invention solves the above and other problems, thereby advancing the state of useful arts, by providing a stacked capacitor structure in which one or two signal side conductive electrodes are substantially enclosed by a grounded shield metal structure (potentially the opposing electrode in the case of a linear capacitor). Where the shield metal structure is the opposing electrode (i.e., a linear capacitor), the shield layers are separated from the signal side electrode by a dielectric material also substantially enclosed within the shield structure. Where the structures are formed as substantially rectangular, box-like structures, the signal side structure is enclosed on all six sides by the ground shield that serves to shield the capacitor structure from crosstalk interference from surrounding structures and signal paths.

A first feature hereof therefore provides a capacitor circuit comprising: one or more signal side metal layers configured in a substantially vertical stack; a dielectric material layer substantially enclosing the signal side metal layers and having an opening to permit electrical coupling to the signal side metal layers; a metal shield substantially enclosing the signal side metal layers on all sides and having an opening to permit electrical coupling to the signal side metal layers.

Another aspect hereof further provides that the metal shield is coupled to a ground level potential such that the capacitor is a linear capacitor.

Another aspect hereof further provides that the one or more signal side metal layers further comprises: a first signal side metal layer; and a second signal side metal layer separated from the first signal side metal layer by the dielectric material and substantially enclosed by the metal shield such that the capacitor is a 2-sided capacitor.

Another aspect hereof further provides that the metal shield further comprises: an upper metal shield layer electrically shielding a top face of the signal side metal layers; a lower metal shield layer electrically shielding a bottom face of the signal side metal layers; and one or more intermediate metal shield layers each configured to electrically shield the perimeter of a corresponding signal side metal layer, wherein the upper metal shield layer, the lower metal shield layer and the intermediate metal shield layers are conductively coupled to one another.

Another aspect hereof further provides that the metal shield is configured to form a box-like structure.

Another aspect hereof further provides that the upper metal shield layer, the lower metal shield layer and the intermediate metal shield layers are conductively coupled to one another through a plurality of vias.

Another feature hereof provides a linear capacitor circuit comprising: an upper shield metal layer adapted to be conductively coupled to a ground potential; a lower shield metal layer adapted to be conductively coupled to the ground potential; a signal side metal electrode positioned between the upper shield metal layer and the lower shield metal layer and adapted to be conductively coupled to a signal source; a perimeter shield adapted to be conductively coupled to the ground potential and configured to substantially surround the perimeter of the signal side metal electrode; and a dielectric material substantially enclosing the signal side metal electrode and substantially enclosed by the upper shield metal layer and the lower shield metal layer and the perimeter shield.

Another aspect hereof further provides that the upper shield metal layer and the lower shield metal layer and the perimeter shield are conductively coupled by a plurality of vias.

Another aspect hereof further provides that wherein the signal side metal electrode further comprises multiple signal side metal layers, and wherein the perimeter shield further comprises one or more intermediate shield metal layers each adapted to be conductively coupled to the ground potential and each positioned to substantially surround a corresponding signal side metal layer such that the multiple signal side metal layers are substantially enclosed on all sides by the upper shield metal layer and the intermediate shield metal layers and the lower shield metal layer.

Another aspect hereof further provides that the upper shield metal layer, the lower shield metal layer and the intermediate shield metal layers are conductively coupled by a plurality of vias.

Another feature hereof provides a linear capacitor comprising: a lower shield metal layer conductively coupled to a ground potential; an upper shield metal layer; an intermediate metal layer between the lower shield metal layer and the upper shield metal layer and including a perimeter shield portion and a signal side portion wherein the signal side portion is adapted to be conductively coupled to a signal source; and a dielectric material configured to electrically isolate the signal side portion from the perimeter shield portion and from the upper shield metal layer and from the lower shield metal layer, wherein the signal side portion is substantially enclosed within a volume defined by the upper shield metal layer and the lower shield metal layer and the perimeter shield portion.

Another aspect hereof further provides that the intermediate layer comprises: a plurality of signal side metal fingers conductively coupled to a signal source; and a plurality of intermediate shield metal fingers interlaced between the plurality of signal side metal fingers.

Another aspect hereof further provides that the intermediate metal layer further comprises: a plurality of vertically stacked intermediate metal layers each of which comprises includes a perimeter shield portion and a signal side portion, wherein the linear capacitor further comprises: a plurality of intermediate signal side vias conductively coupling the signal side portions of the plurality of vertically stacked intermediate metal layers; and a plurality of intermediate shield vias conductively coupling the perimeter shield portions of the plurality of vertically stacked intermediate metal layers.

Another feature provides a 2-sided capacitor comprising: a lower shield metal layer conductively coupled to a ground potential; an upper shield metal layer; a first intermediate metal layer between the lower shield metal layer and the upper shield metal layer and including a first perimeter shield portion and a first signal side portion wherein the first signal side portion is adapted to be conductively coupled to a signal source; a second intermediate metal layer between the lower shield metal layer and the upper shield metal layer proximate the first intermediate metal layer and including a second perimeter shield portion and a second signal side portion wherein the second signal side portion is adapted to be conductively coupled to a signal source; and a dielectric material configured to electrically isolate the first signal side portion from the second signal side portion and configured to isolate both the first signal side portion and the second signal side portion from the first perimeter shield portion and from the second perimeter shield portion and from the upper shield metal layer and from the lower shield metal layer, wherein the first signal side portion and the second signal side portion are substantially enclosed within a volume defined by the upper shield metal layer and the lower shield metal layer and the first and second perimeter shield portions.

Another aspect hereof further provides that wherein the first intermediate layer comprises: a plurality of first signal side metal fingers conductively coupled to a signal source; and a plurality of first intermediate shield metal fingers interlaced between the plurality of first signal side metal fingers, and wherein the second intermediate layer comprises: a plurality of second signal side metal fingers conductively coupled to a signal source; and a plurality of second intermediate shield metal fingers interlaced between the plurality of second signal side metal fingers.

DETAILED DESCRIPTION OF THE DRAWINGS

Figure 1:
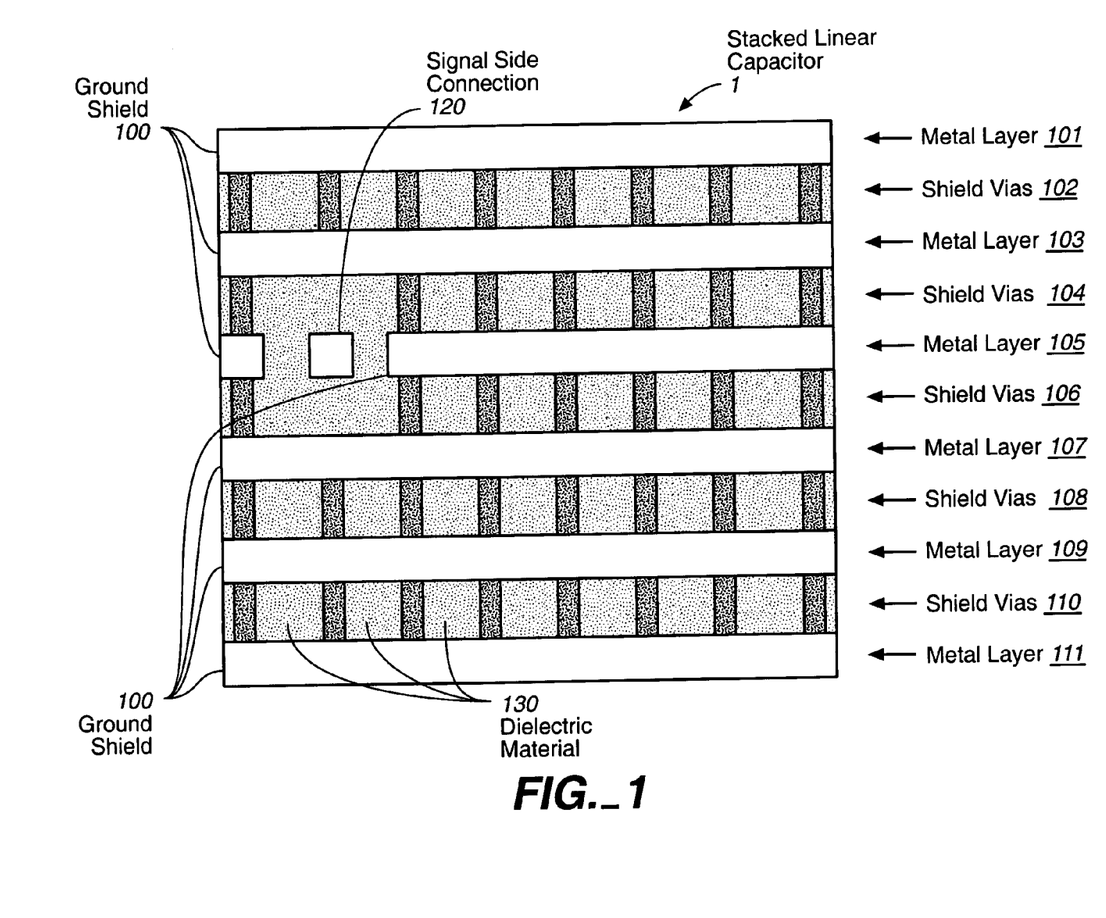
FIG. 1 is a side view of an exemplary stacked, linear capacitor embodying features and aspects hereof to reduce crosstalk interference.

FIG. 1 is a side view of an exemplary, multiple layer, linear capacitor 1 exhibiting features and aspects hereof. Those of ordinary skill and the art of recognize that the capacitor structure depicted in FIG. 1 is a structure that may be constructed upon a substrate surface in accordance with well-known semiconductor fabrication techniques including deposition and etching. The substrate material and surrounding circuit structures are removed for simplicity in FIG. 1 but would it be readily recognized by those of ordinary skill in the art.

The linear capacitor 1 of FIG. 1 is a three dimensional structure from a side view perspective. FIG. 1 shows an exemplary linear capacitor 1 comprising a plurality of metal layers 100 substantially enclosing and surrounding a dielectric material 130 and surrounding signal side metal portions shown in this side view only as entry point for signal side 120. Subsequent cutaway top views in FIGS. 2 through 7 show each of the individual metal layers and corresponding interconnecting vias 101 through 111. All metal shield layers (101, 103, 105, 107, 109, and 111) are coupled together through vias (102, 104, 106, 108, and 110) and are coupled to a ground potential (not shown). Signal side metal structures (shown only as signal side entry 120 in FIG. 1) are substantially enclosed between the upper ground shield metal layer 101 and the lower ground shield metal layer 111 and by other intermediate shield metal layers (103, 105, 107, and 109) and by vias (102, 104, 106, 108, and 110).

By substantially in closing the signal side metal portions within grounded shield metal layers and via structures, crosstalk interference from nearby signal paths and circuit structures (not shown) is substantially reduced. In particular, adjacent linear capacitor structures may abut the linear capacitor 1 of FIG. 1 because all external surfaces of the linear capacitor represent grounded shield metal structures. A similar abutting, adjacent linear capacitor structure, for example, may therefore contact its shielded metal layers to the shield metal layers of the depicted linear capacitor 1. Such an abutted, conductively coupled shield structure not only reduces potential for crosstalk but may provide still further shielding from other surrounding structures and signal paths.

Those of ordinary skill in the art will recognize that any number of intermediate layers may be provided in accordance with features and aspects hereof. The depicted structure provides at least an upper shield metal layer 101 and a lower shield metal layer 111. As shown, four intermediate shield metal layers 103, 105, 107, and 109 are provided but are intended merely as representative of one exemplary structure. The particular number of layers may be adapted as a matter of design choice based upon physical space constraints of the desired circuit die and electrical capacitance requirements for the intended capacitor design.

Figure 2:
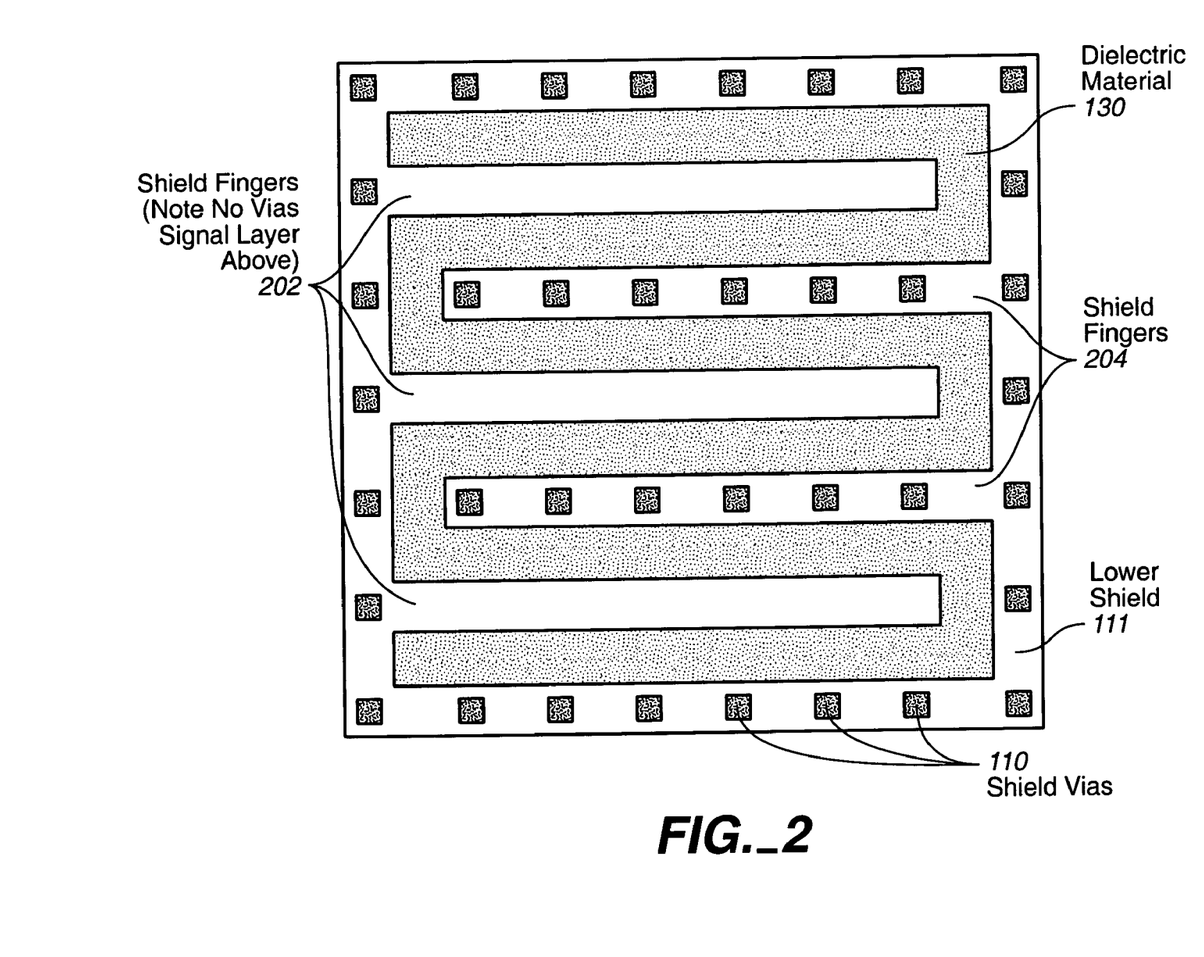
FIGS. 2–7 are top views of the exemplary stacked layers of the capacitor of FIG. 1.

FIG. 2 is a cutaway top view removing all upper and intermediate metal layers to reveal the bottom shield metal layer 111. Bottom shield metal layer 111 may comprise a plurality of interlaced metal fingers 202 and 204 extending inward from the outer perimeter of the layer 111. A plurality of vias 110 are positioned around the perimeter of bottom shield metal layer 111 to conductively couple the layer with the next metal layer up in the stacked structure shown in FIG. 1. Notably, shield fingers 204 include vias 110 to permit conductive coupling to the next higher metal layer while shield fingers 202 are devoid of such vias due to the nature of the metal structure above them. None the less, shield fingers 202 are conductively coupled to the ground potential as an integral part of the shield metal layer 111. As will be discussed in FIG. 3, the metal structures above shield fingers 202 are signal side metal structures and thus not conductively coupled to shield fingers 202 through the vias 110.

Figure 3:
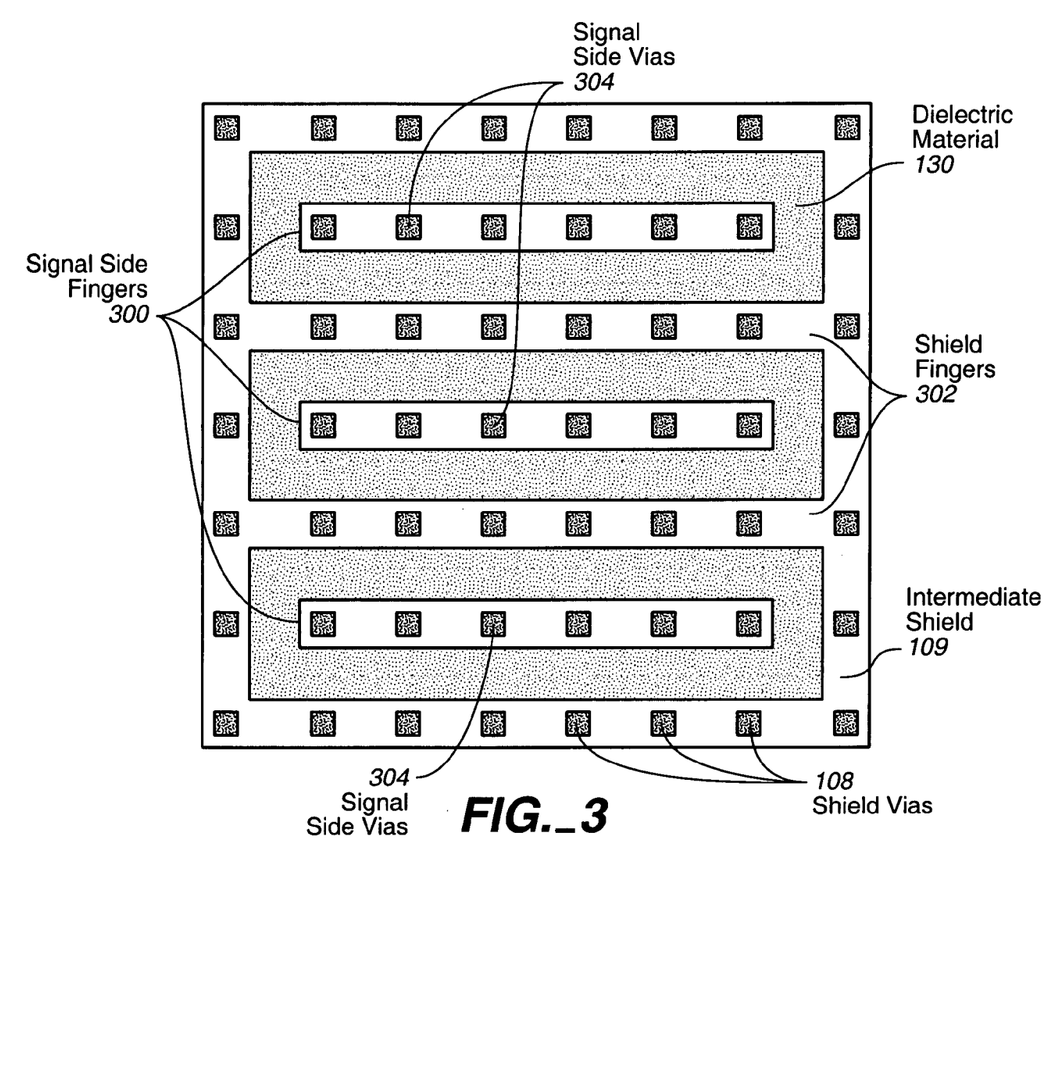

FIG. 3 shows a cutaway top view of a next higher layer in the stacked capacitor 1 shown in FIG. 1. In particular, FIG. 3 shows ground shield metal layer 109 of FIG. 1 with all higher layer structures removed for simplification. The outer perimeter of grounded shield metal layer 109 provides shielding around the entire perimeter of the structure. Single signal side fingers 300 are conductively coupled to a signal source through signal vias 304 (coupling the fingers 300 to other signal side structures that are, in turn, coupled to a signal source). Ground shield vias 108 couple the ground shield metal layer 109, including shield fingers 302, to a next higher layer in the stacked linear capacitor 1 of FIG. 1. Those of ordinary skill in the art will recognize that signal side fingers 300 are surrounded in the horizontal plane of figure three by shield metal structures including the perimeter of ground shield 109 and shield fingers 302. Further, shield fingers 202 of FIG. 2 (discussed above) provide shielding below signal side fingers 300 of FIG. 3. Further structures discussed herein below provide shielding above signals side fingers 300.

Figure 4:
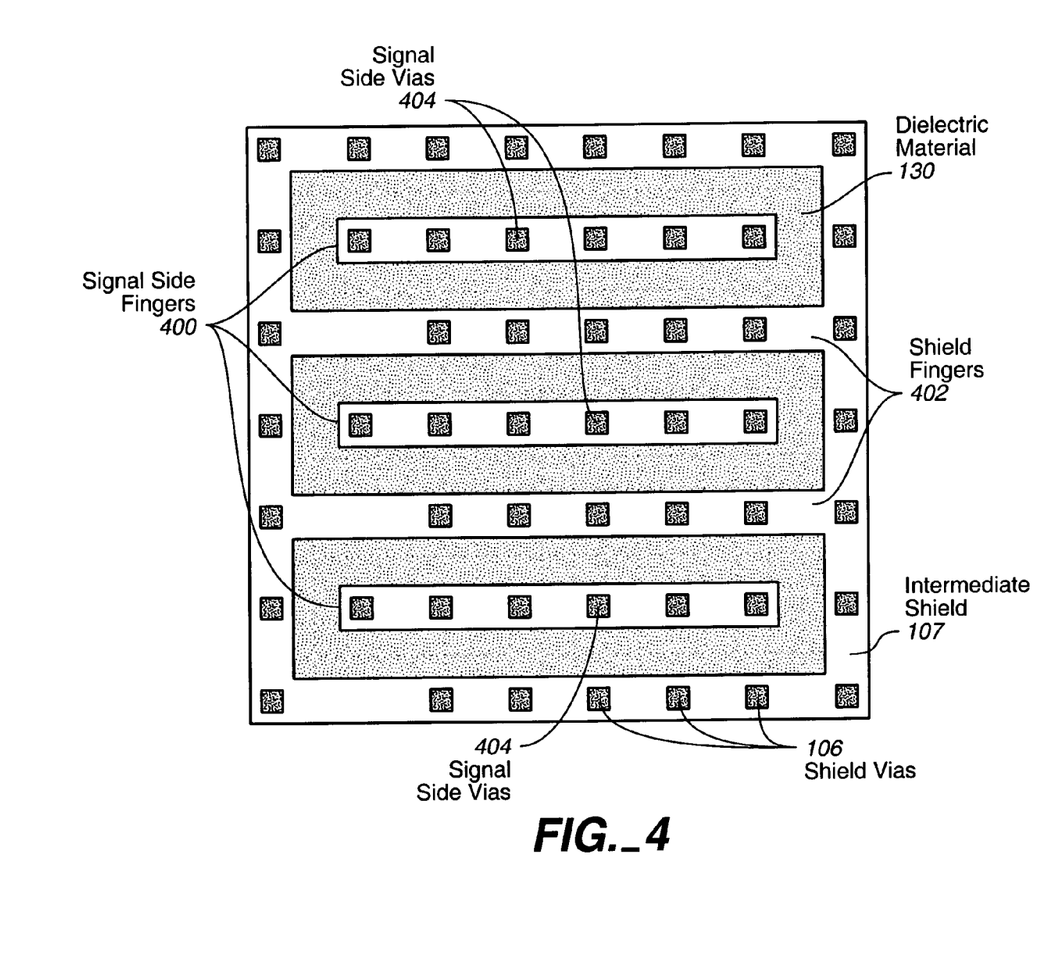

FIG. 4 is a cutaway top view of a stacked linear capacitor 1 of FIG. 1 showing a next ground in shield metal layer 107 enclosing dielectric material 130 and enclosing signal side metal fingers 400. Signal side fingers 400 are conductively coupled to signal side fingers 300 of FIG. 3, discussed above, by signal vias 304 of FIG. 3. Signal vias 404 of FIG. 4, in turn, couple signal side fingers 400 to corresponding signal side structures in the next higher layer discussed further herein below. As noted above with respect to FIG. 3, signal side fingers 400 are shielded in the horizontal plane of FIG. 4 by the perimeter structure of ground shield metal layer 107 including ground shield fingers 402. Ground shield vias 106 couple the perimeter of ground shield metal layer 107, including ground shield fingers of 402, to a next higher layer in the stacked capacitor structure.

Figure 5:
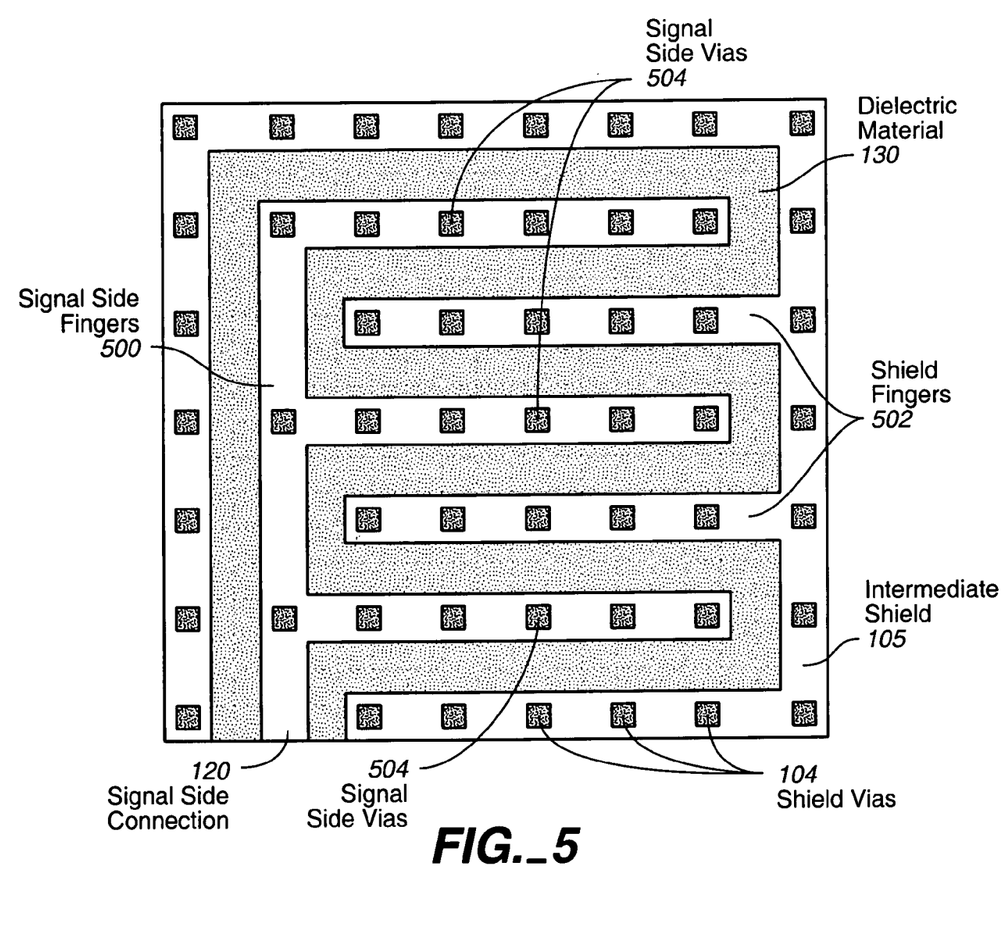

FIG. 5 is a cutaway top view showing the next higher layer in the stacked capacitor 1 of FIG. 1. Ground shield metal layer 105 provides perimeter shielding for the signal side fingers 500. Signal vias 504 couple signal side fingers 500 to the next higher layer in the stacked capacitor 1 of FIG. 1. Ground shield vias 104 couple ground shield metal layer 105, including ground shield fingers 502, to corresponding shield structures in the next higher layer. Opening 120 provides for conductive coupling to the single side fingers 500 and, through signal vias 504, 404 and 304, conductive coupling to all lower and higher layer signal side metal in the stacked capacitor 1 of FIG. 1.

Figure 6:
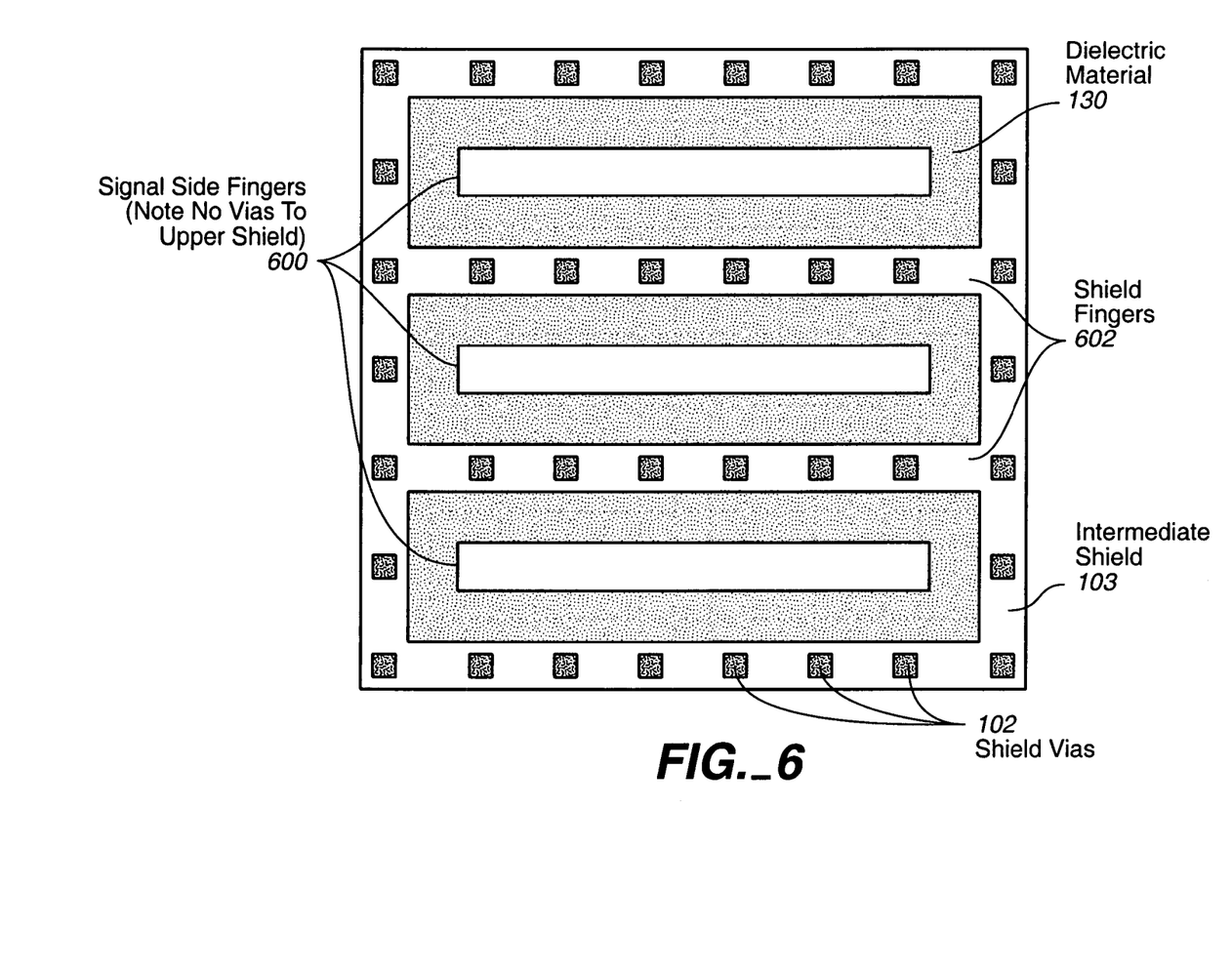

FIG. 6 shows a cutaway top view of a next higher layer in the stacked capacitor 1 of FIG. 1. Ground shield metal layer 103 provides shielding to enclose the signal side fingers 600. Shield vias 102 couple ground shield metal layer 103, including ground shield fingers 602, to the next higher shield metal layer discussed further herein below. Signal side fingers 600 are coupled to all lower layer signal side fingers through vias 504 of FIG. 5 and corresponding signal side vias of other, lower layer, signal side metal structures.

Figure 7:
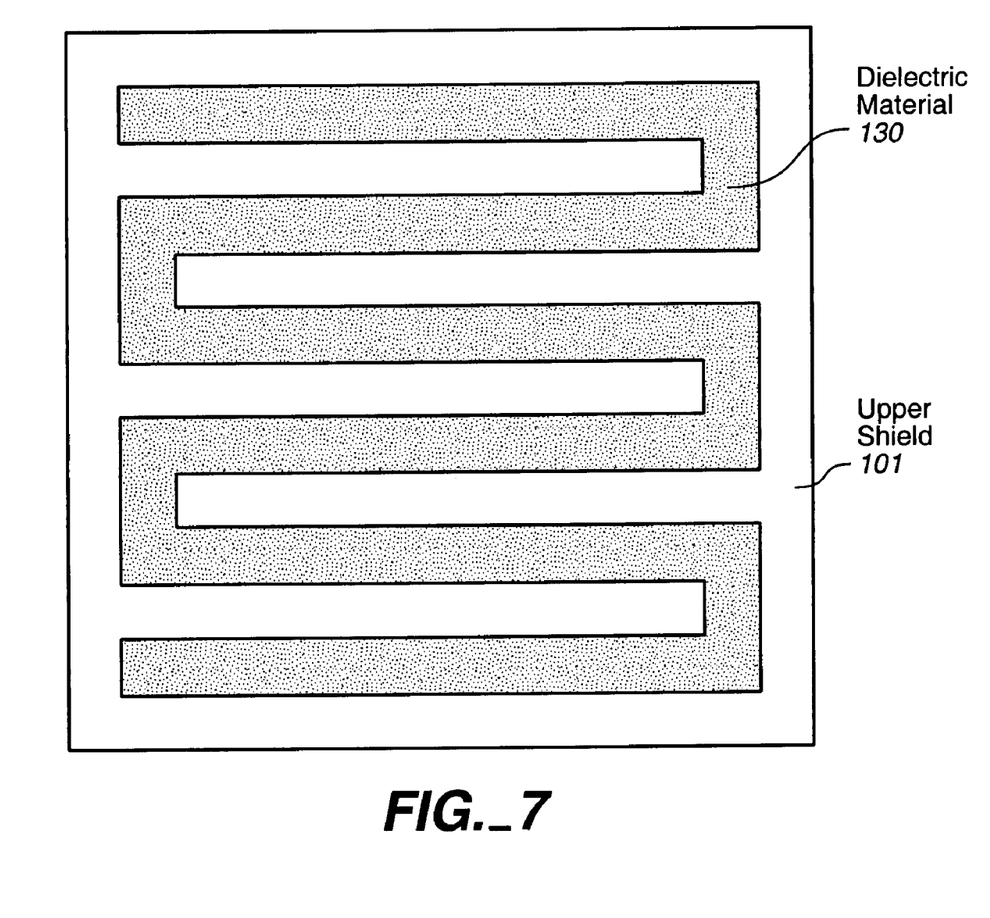

FIG. 7 shows a top view of ground shield metal layer 101 of the stacked capacitor 1 of FIG. 1. Ground shield metal layer 101 provides upper layer shielding for the stacked capacitor including, in particular, all signal side metal layers described herein below with respect to FIGS. 3 through 6. Upper ground shield metal layer 101 is coupled to all lower layer ground shield metal structures through shield vias 102 discussed above with respect to FIG. 6.

The shield fingers 302, 402, 502, and 602 of the intermediate layers provide additional surface area to increase the coupling capacitance of the stacked linear capacitor design. The outer perimeter of each intermediate metal layer (103, 105, 107, and 109) coupled with the upper shield layer (101) in its entirety and the lower shield layer (111) in its entirety form a box to substantially enclose the signal side metal within. The shield vias 102, 104, 106, 108, and 110 interconnect the various perimeters and upper and lower shield components and provide further shielding as a grounded element.

Those of ordinary skill in the art will recognize a wide variety of equivalent geometries and configurations for providing a fully shielded, stacked, linear capacitor structure in accordance with features and aspects hereof. In particular, any number of layers may be provided intermediate the upper and lower shield metal layers. Further, any number of fingers or portions for signal sided metal structures may be provided enclosed within corresponding shield structures. For example, a single signal side metal structure may be substantially enclosed by upper and lower shield metal structures (separated by a dielectric material) to provide a simpler embodiment of features and aspects hereof. Such a single signal side capacitor would have limited practical value due to the severely limited coupling capacitance of such a small structure. The surface area for coupling capacitance would simply be too small for practical use of such a capacitor.

Further, the plurality of vias positioned about the perimeter of the upper and lower shield metal layers (as well as intermediate shield metal layers) may be implemented as a shield curtain of solid metal (as permitted by current or future semiconductor fabrication processes and systems) as well as the depicted plurality of vias positioned about the perimeter. In other words, the shield metal structure may form a box like structure substantially enclosing the signal side metal structure within as well as enclosing the dielectric material separating the shield "box" from the enclosed signal side metal structure. An opening in such a box provides for conductive coupling to the enclosed signal side metal structure. The stacked capacitor 1 of FIG. 1 and the additional detailed top views of FIGS. 2 through 7 are therefore intended merely as a representative of one possible, exemplary embodiment of features and aspects hereof.

Figure 8:
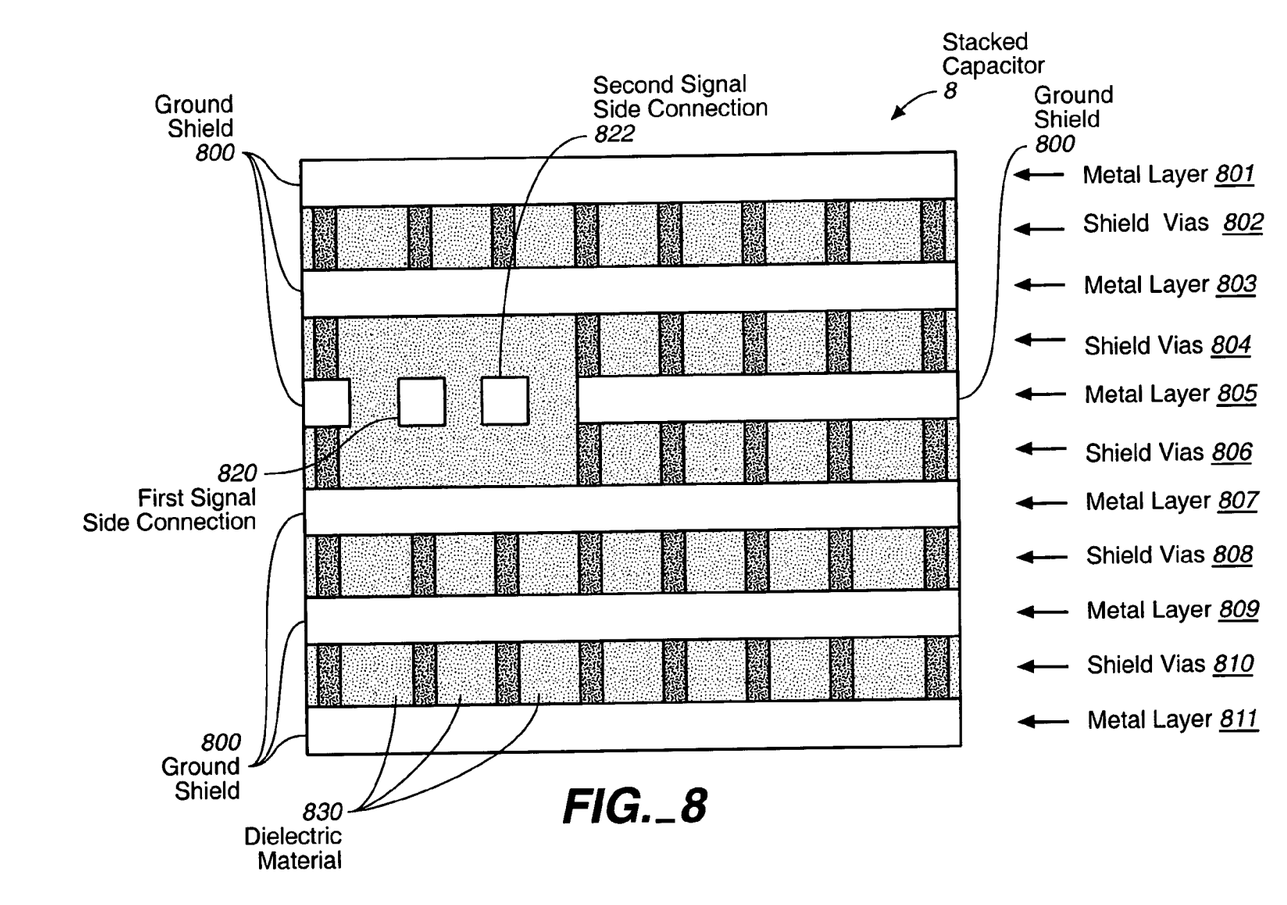
FIG. 8 is a side view of an exemplary stacked, 2-sided capacitor embodying features and aspects hereof to reduce crosstalk interference.

In another aspect, the stacked structure may provide a 2-sided capacitor within a shielded box-like structure similar to the shielding structure presented above as a linear stacked capacitor. FIG. 8 is a side view of such an exemplary stacked, 2-sided capacitor 8 similar to the stacked linear capacitor structure of FIG. 1. Grounded shield metal layers 800 substantially surround the two electrode structures enclosed within. Dielectric material 830, also substantially enclosed within capacitor 8, separates the two conductive metal electrodes within the capacitor 8 to provide the desired coupled capacitance. An opening in the ground shield layers 800 permits conductive coupling to the first signal side connection 820 and to the second signal side connection 822. Each of the exemplary layers 801, 803, 805, 807, 809, and 811 are discussed in additional detail herein below along with the associated plurality of vias 802, 804, 806, 808, and 810.

Figure 9:
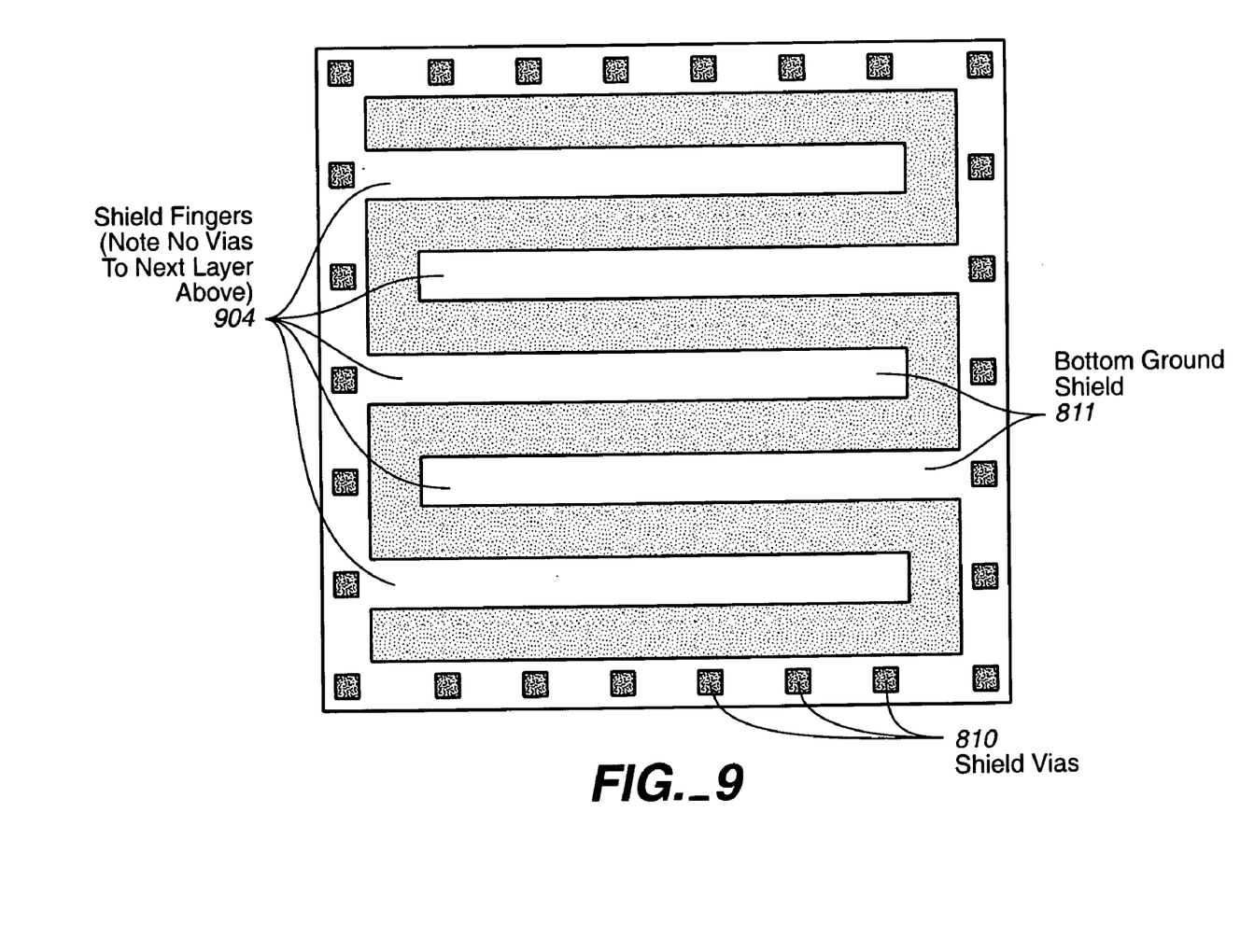
FIGS. 9–14 are top views of the exemplary stacked layers of the capacitor of FIG. 8.

FIG. 9 is a top view of bottom shield layer 811 with all upper layers cutaway for simplicity. The perimeter of bottom shield 811 as well as shield fingers 904 provide complete shielding of the capacitor 8 of FIG. 8 on its bottom face and serve to substantially enclose the 2-sided capacitor structure at its bottom face. Shield vias 810 couple the perimeter of the shield layer 811 to the next layer above and discussed herein below with respect to FIG. 10. Shield fingers 904 are conductively integral with the perimeter metal material but are not coupled to the signal metal portions above in the next layer through vias.

Figure 10:
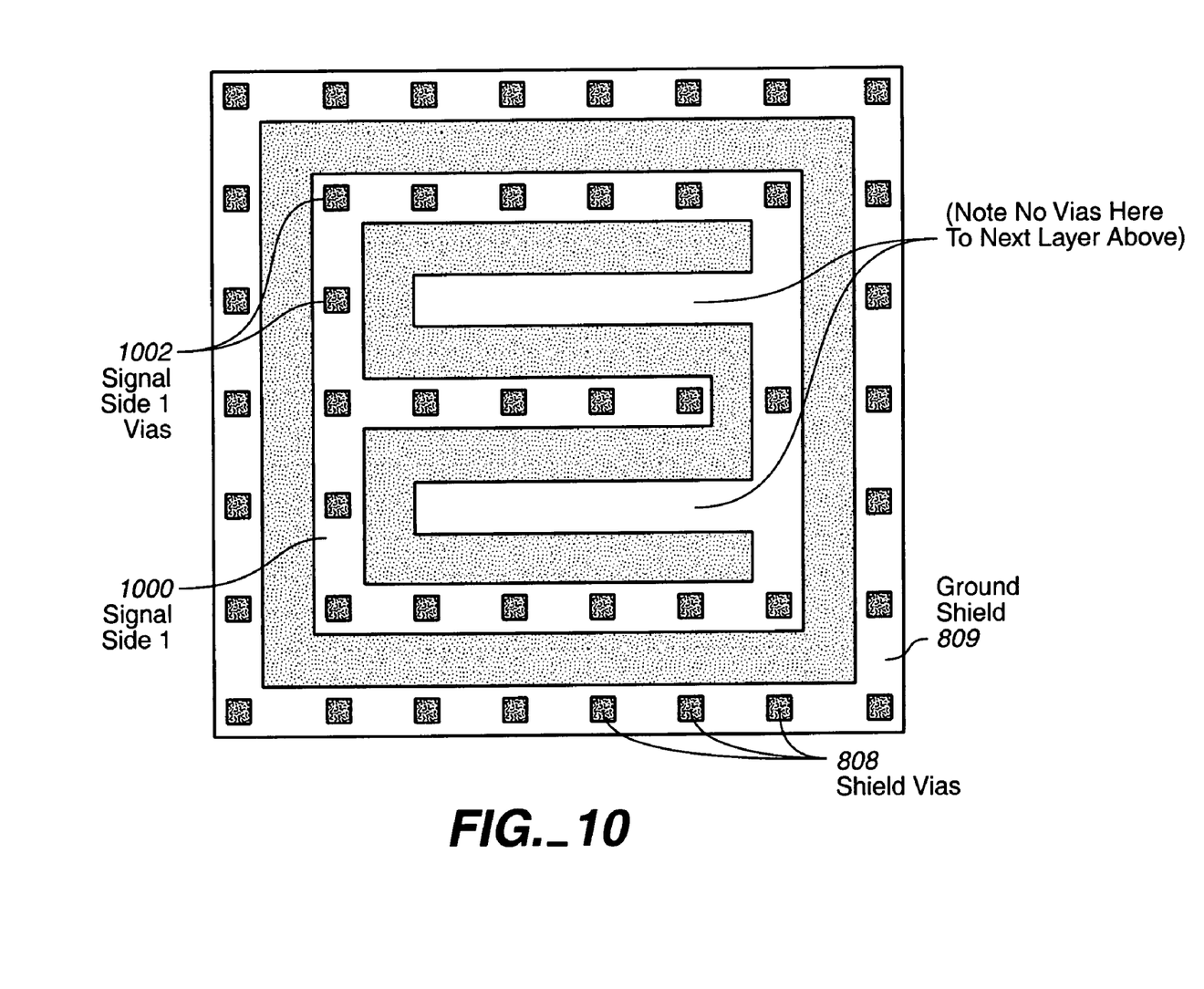

FIG. 10 shows a top view of the next metal layer 809 above bottom shield layer 811 with all higher layers cut away for simplicity. Layer 809 has a shield portion about its perimeter that shields the perimeter of the structure and is coupled to the lower bottom shield layer 811 (through vias 810) and to the next layer up (through vias 808). Signal side 1 element 1000 provides electrodes for the coupled capacitance of the 2-sided capacitor 8. Signal side 1 vias 1002 couple the perimeter of the signal side 1 structure and its middle finger portion to the next metal layer above. Noteworthy is the lack of vias in other fingers of the metal structure where signal side 2 metal is directly above as discussed further herein below.

Figure 11:
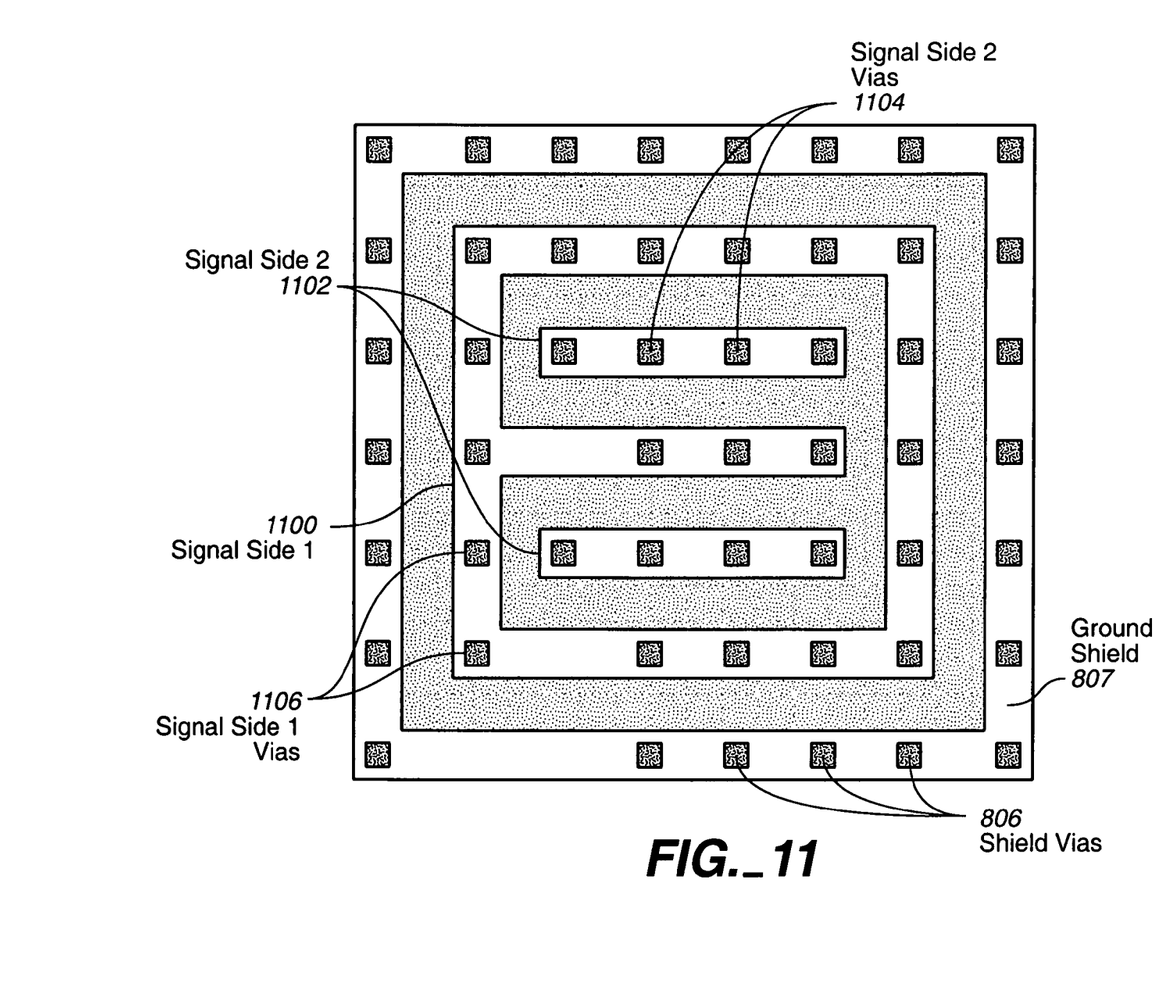

FIG. 11 shows a top view of a next higher metal layer 807 above the prior layer 809. The perimeter shield portion of the metal layer 807 provides grounded shielding of the inner signal related portions of the metal layer and is coupled to the corresponding perimeter shield portion 809 below by vias 808 of FIG. 10 and is coupled to corresponding shield structures in layers above by vias 806. Signal side 1 1100 is coupled to the corresponding signal side 1 metal structure 1000 of FIG. 10 by signal side 1 vias 1002 and is coupled to the corresponding signal side 1 metal structure in the layer above by vias 1106. Signal side 2 metal structures 1102 are coupled to corresponding signal side 2 structures in the layers above but are not coupled to the layer below.

Figure 12:
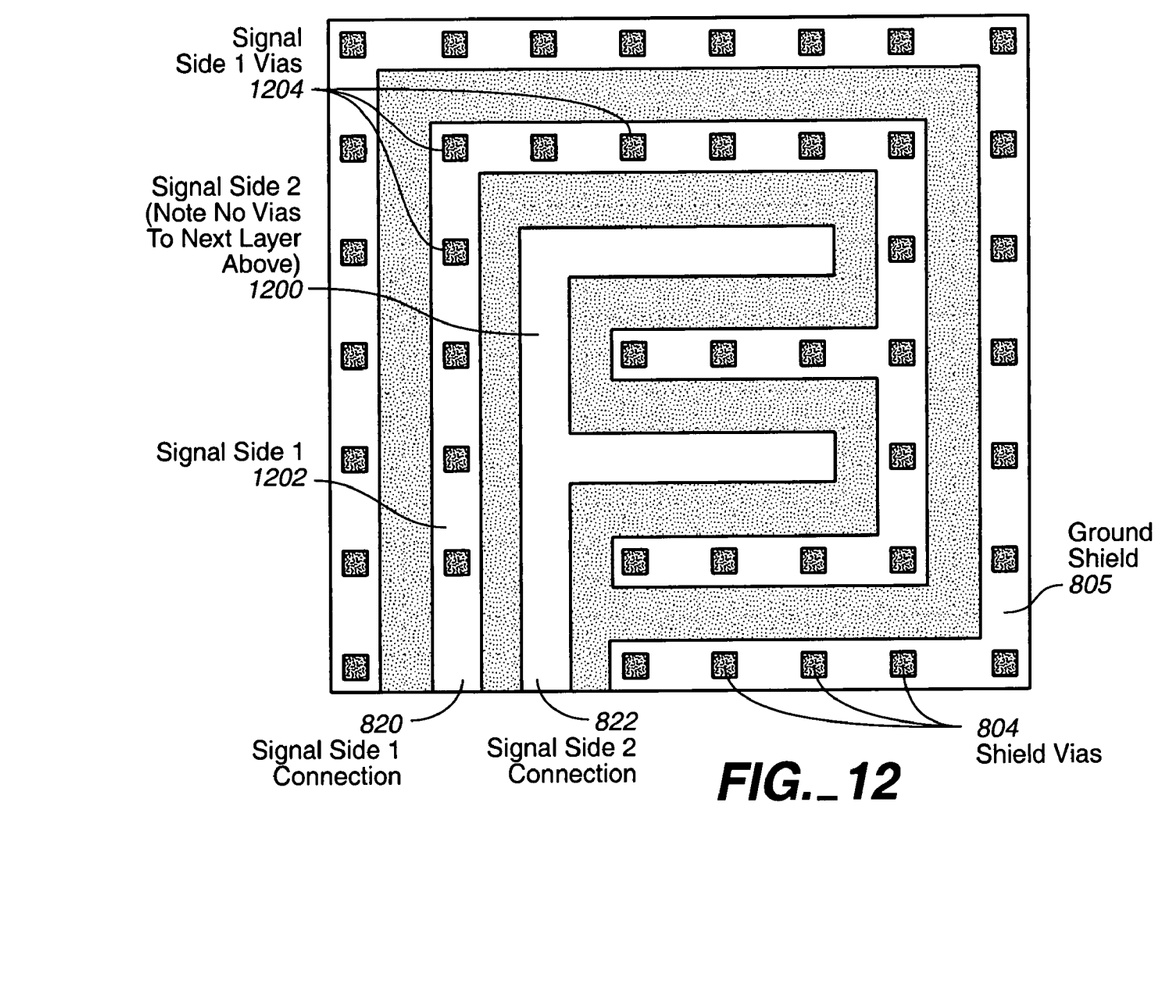

FIG. 12 shows a top view of a next higher layer 805 above the prior layer 807. Ground shield perimeter portion 805 is coupled to the corresponding structure in the layer below by vias 806 of FIG. 11 and coupled to corresponding perimeter shield portions in the layer above by vias 804. Signal side 2 portion 1200 is coupled to the corresponding signal side 2 portion 1102 of FIG. 11 by vias 1104 but is not coupled to any layer above in view of the lack of vias. Signal side 1 portion 1202 is coupled to the corresponding signal side 1 portion 1100 of the layer below by vias 1106 of FIG. 11 and is coupled to corresponding structures in the layer above by vias 1204.

Figure 13:
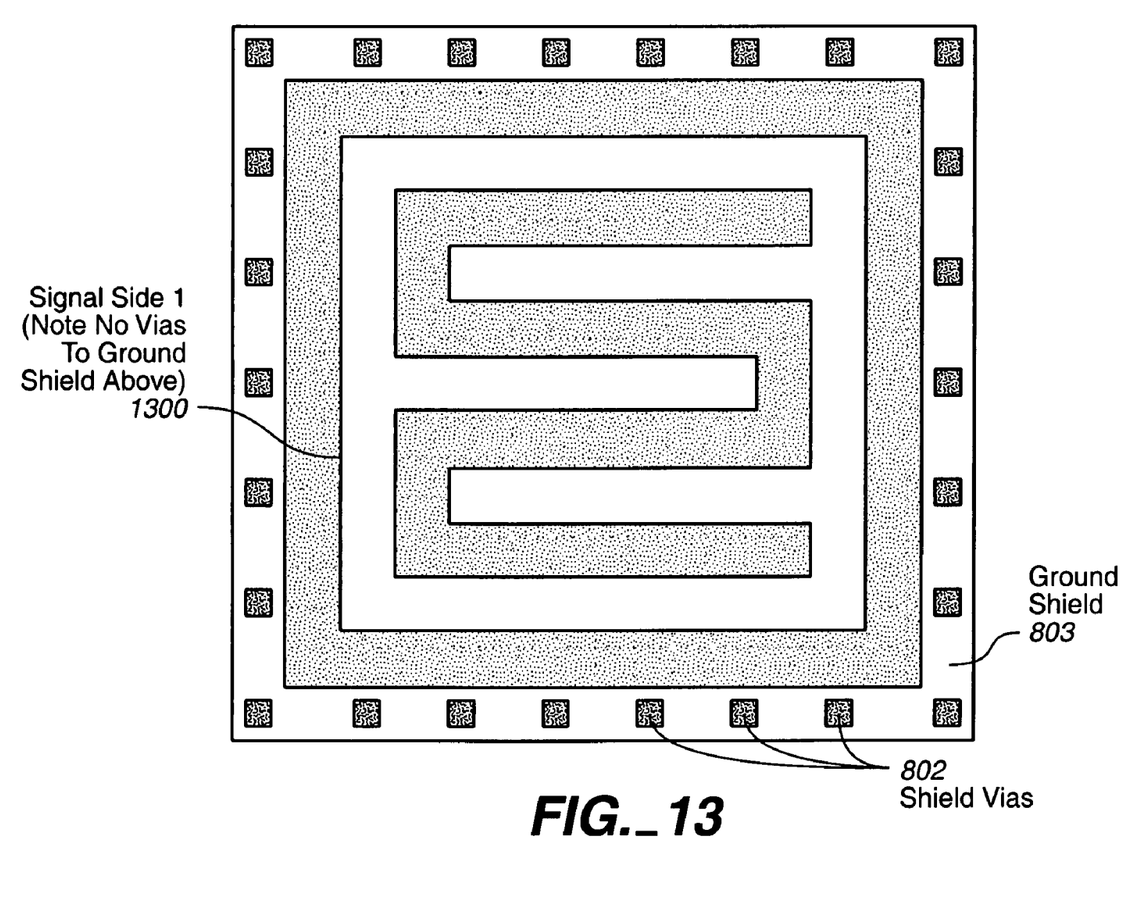

FIG. 13 shows a top view of the next metal layer 803 above layer 805 with all higher layers cut away for simplicity. Layer 803 has a shield portion about its perimeter that shields the perimeter of the structure and is coupled to the perimeter shield of the next lower layer 805 (through vias 804) and to the next layer up (through vias 802). Signal side 1 element 1300 is coupled to the corresponding signal side 1 element 1202 of FIG. 12 by vias 1204. Noteworthy is the lack of vias in signal side 1 portion 1300 to the next higher layer—a ground shield layer.

Figure 14:
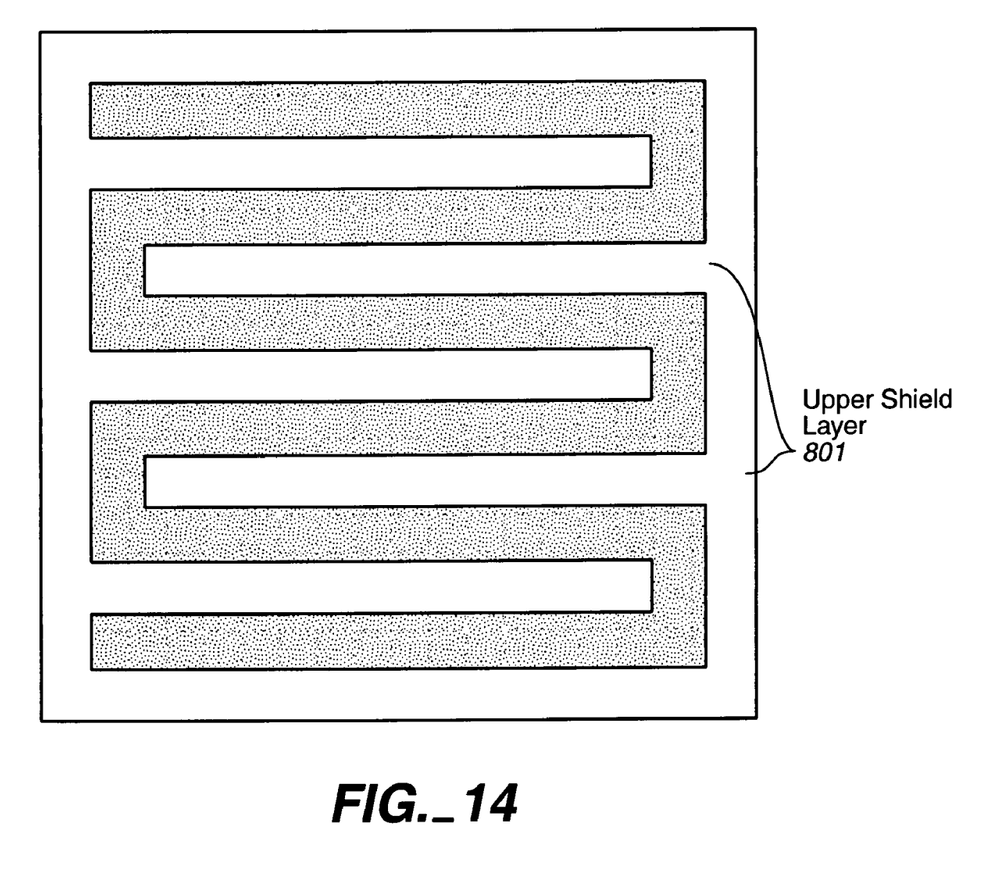

FIG. 14 shows a top view of the upper ground shield layer 801 coupled to the perimeter portion of the lower layer 803 by vias 802 of FIG. 13. Upper ground shield 801 in combination with lower shield 811 of FIG. 9 and the perimeter shield portion of layers 803, 805, 807, and 809 provide a box-like structure to substantially completely enclose the 2-sided metal-metal capacitor within (and the dielectric material 830 positioned everywhere between the various surfaces of signal side 1 portions, signal side 2 portions and enclosing ground shield portions. The enclosure of the capacitor structure reduces crosstalk interference from nearby signal routes and other circuits.

Those of ordinary skill in the art will readily recognize numerous equivalent structures for providing the desired 2-sided capacitance structure substantially enclosed within a grounded shield. Further, those of ordinary skill will recognize that any number of layers and structures may be configured within the enclosing shield box-like structure to provide the requisite surface area for the desired capacitance. Further, as above, the plurality of vias coupling each shield layer may provide any desired number of vias or may be implemented as solid walls of metal as permitted by present or future semiconductor fabrication techniques.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A capacitor circuit comprising:
   one or more signal side metal layers configured in a substantially vertical stack;
   a dielectric material layer substantially enclosing the signal side metal layers and having an opening to permit electrical coupling to the signal side metal layers;
   a metal shield substantially enclosing the signal side metal layers on all sides, substantially enclosing the dielectric material layer on all sides, and having an opening to permit electrical coupling to the signal side metal layers.

2. The capacitor of claim 1 wherein the metal shield is coupled to a ground level potential such that the capacitor is a linear capacitor.

3. The capacitor of claim 1 wherein the one or more signal side metal layers further comprises:
   a first signal side metal layer; and
   a second signal side metal layer separated from the first signal side metal layer by the dielectric material and substantially enclosed by the metal shield such that the capacitor is a 2-sided capacitor.

4. The capacitor of claim 1 wherein the metal shield further comprises:

an upper metal shield layer electrically shielding a top face of the signal side metal layers;

a lower metal shield layer electrically shielding a bottom face of the signal side metal layers; and one or more intermediate metal shield layers each configured to electrically shield the perimeter of a corresponding signal side metal layer, wherein the upper metal shield layer, the lower metal shield layer and the intermediate metal shield layers are conductively coupled to one another.

5. The capacitor of claim 4 wherein the metal shield is configured to form a box-like structure.

6. The capacitor of claim 4 wherein the upper metal shield layer, the lower metal shield layer and the intermediate metal shield layers are conductively coupled to one another through a plurality of vias.

7. A linear capacitor circuit comprising:

an upper shield metal layer adapted to be conductively coupled to a ground potential;

a lower shield metal layer adapted to be conductively coupled to the ground potential;

a signal side metal electrode positioned between the upper shield metal layer and the lower shield metal layer and adapted to be conductively coupled to a signal source;

a perimeter shield adapted to be conductively coupled to the ground potential and configured to substantially surround the perimeter of the signal side metal electrode; and a dielectric material substantially enclosing the signal side metal electrode and substantially enclosed by the upper shield metal layer and the lower shield metal layer and the perimeter shield.

8. The linear capacitor of claim 7 wherein the upper shield metal layer and the lower shield metal layer and the perimeter shield are conductively coupled by a plurality of vias.

9. The linear capacitor of claim 7 wherein the signal side metal electrode further comprises multiple signal side metal layers, and wherein the perimeter shield further comprises one or more intermediate shield metal layers each adapted to be conductively coupled to the ground potential and each positioned to substantially surround a corresponding signal side metal layer such that the multiple signal side metal layers are substantially enclosed on all sides by the upper shield metal layer and the intermediate shield metal layers and the lower shield metal layer.

10. The linear capacitor of claim 9 herein the upper shield metal layer, the lower shield metal layer and the intermediate shield metal layers are conductively coupled by a plurality of vias.

11. A linear capacitor comprising:

a lower shield metal layer conductively coupled to a ground potential;

an upper shield metal layer;

an intermediate metal layer between the lower shield metal layer and the upper shield metal layer and including a perimeter shield portion and a signal side portion wherein the signal side portion is adapted to be conductively coupled to a signal source; and a dielectric material configured to electrically isolate the signal side portion from the perimeter shield portion and from the upper shield metal layer and from the lower shield metal layer, wherein the signal side portion is substantially enclosed within a volume defined by the upper shield metal layer and the lower shield metal layer and the perimeter shield portion.

12. The liner capacitor of claim 11 wherein the intermediate layer comprises:

a plurality of signal side metal fingers conductively coupled to a signal source; and a plurality of intermediate shield metal fingers interlaced between the plurality of signal side metal fingers.

13. The liner capacitor of claim 11 wherein the intermediate metal layer further comprises:

a plurality of vertically stacked intermediate metal layers each of which comprises includes a perimeter shield portion and a signal side portion, wherein the linear capacitor further comprises:

a plurality of intermediate signal side vias conductively coupling the signal side portions of the plurality of vertically stacked intermediate metal layers; and a plurality of intermediate shield vias conductively coupling the perimeter shield portions of the plurality of vertically stacked intermediate metal layers.

14. A 2-sided capacitor comprising:

a lower shield metal layer conductively coupled to a ground potential;

an upper shield metal layer;

a first intermediate metal layer between the lower shield metal layer and the upper shield metal layer and including a first perimeter shield portion and a first signal side portion wherein the first signal side portion is adapted to be conductively coupled to a signal source;

a second intermediate metal layer between the lower shield metal layer and the upper shield metal layer proximate the first intermediate metal layer and including a second perimeter shield portion and a second signal side portion wherein the second signal side portion is adapted to be conductively coupled to a signal source; and a dielectric material configured to electrically isolate the first signal side portion from the second signal side portion and configured to isolate both the first signal side portion and the second signal side portion from the first perimeter shield portion and from the second perimeter shield portion and from the upper shield metal layer and from the lower shield metal layer, wherein the first signal side portion and the second signal side portion are substantially enclosed within a volume defined by the upper shield metal layer and the lower shield metal layer and the first and second perimeter shield portions.

15. The 2-sided capacitor of claim 14 wherein the first intermediate layer comprises:

a plurality of first signal side metal fingers conductively coupled to a signal source; and a plurality of first intermediate shield metal fingers interlaced between the plurality of first signal side metal fingers, and wherein the second intermediate layer comprises:

a plurality of second signal side metal fingers conductively coupled to a signal source; and a plurality of second intermediate shield metal fingers interlaced between the plurality of second signal side metal fingers.

* * * * *